United States Patent
Tanikoshi et al.

(10) Patent No.: US 6,794,724 B2
(45) Date of Patent: Sep. 21, 2004

(54) MODULE FOR OPTICAL COMMUNICATIONS FOR CONVERTING LIGHT AND DIFFERENTIAL SIGNALS

(75) Inventors: Sadao Tanikoshi, Kawasaki (JP); Masato Yoshida, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/244,941

(22) Filed: Sep. 17, 2002

(65) Prior Publication Data

US 2003/0052379 A1 Mar. 20, 2003

(30) Foreign Application Priority Data

Sep. 20, 2001 (JP) .......................................... 2001-287658

(51) Int. Cl.$^7$ .......................................... H01L 31/0232

(52) U.S. Cl. ....................... 257/432; 257/459; 257/692; 257/696; 257/776; 385/88; 385/92

(58) Field of Search ................................. 257/432, 433, 257/459, 664, 692, 696, 773, 776; 385/88, 92

(56) References Cited

U.S. PATENT DOCUMENTS 6,285,043 B1    9/2001  Yap
6,603,782 B2 *  8/2003  Nakanishi et al. ............ 372/36

FOREIGN PATENT DOCUMENTS

JP          06-342858         12/1994

* cited by examiner

Primary Examiner—Jerome Jackson
(74) Attorney, Agent, or Firm—Hogan & Hatson, LLP

(57) ABSTRACT

A module for optical communications includes a light receiving element which converts the light signal to an electric signal and an insulating substrate including first and second surfaces opposite to each other. An output section is provided on the first surface and extracts the electric signal as reverse and non-reverse signals. First and second connection terminals are connected to the output section and output the reverse and non-reverse signals. First and second wiring patterns are provided on the first surface. The first and second wiring patterns are electrically connected to one of the first and second wiring patterns and the other one thereof. The first and second wiring patterns have first and second ends, respectively. The first and second ends are provided in order in a direction intersecting with a line connecting the first and second connection terminals.

23 Claims, 8 Drawing Sheets

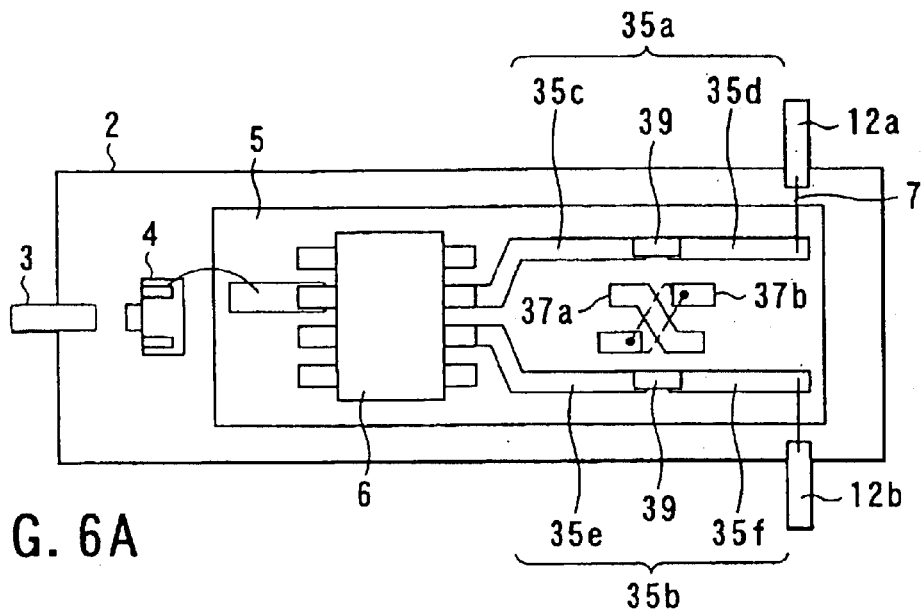
FIG. 6A
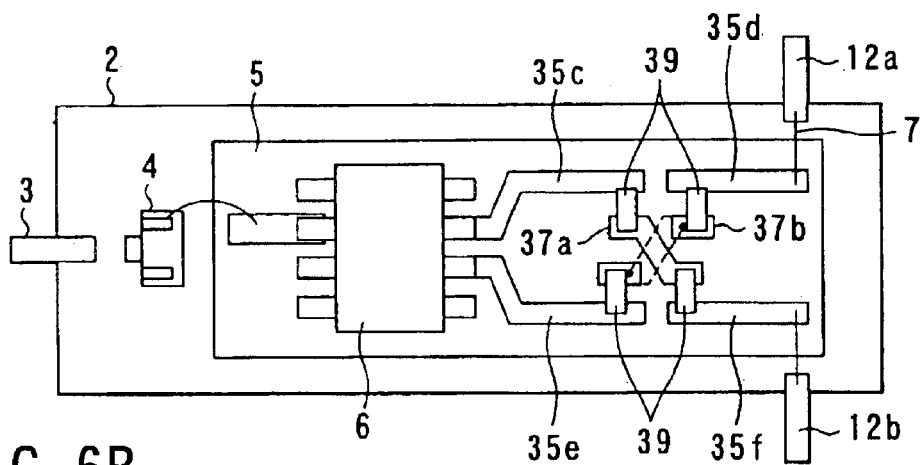
FIG. 6B
|  | Connection non-reversed | | Connection reversed | |
|---|---|---|---|---|
| Light signal | ON | OFF | ON | OFF |
| Lead pin 12a | 'H' | 'L' | 'L' | 'H' |
| Lead pin 12b | 'L' | 'H' | 'H' | 'L' |
FIG. 6C

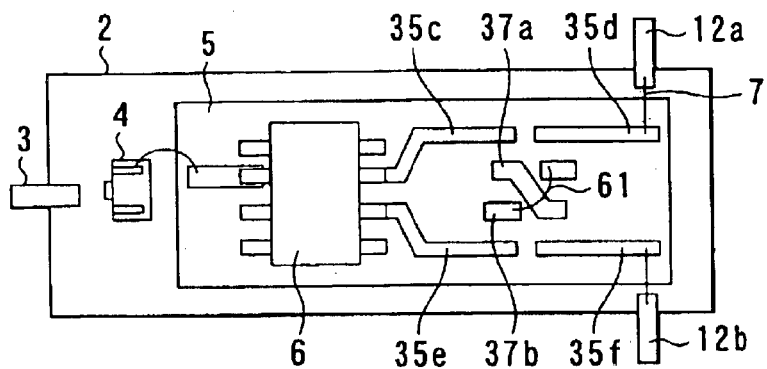
FIG. 7
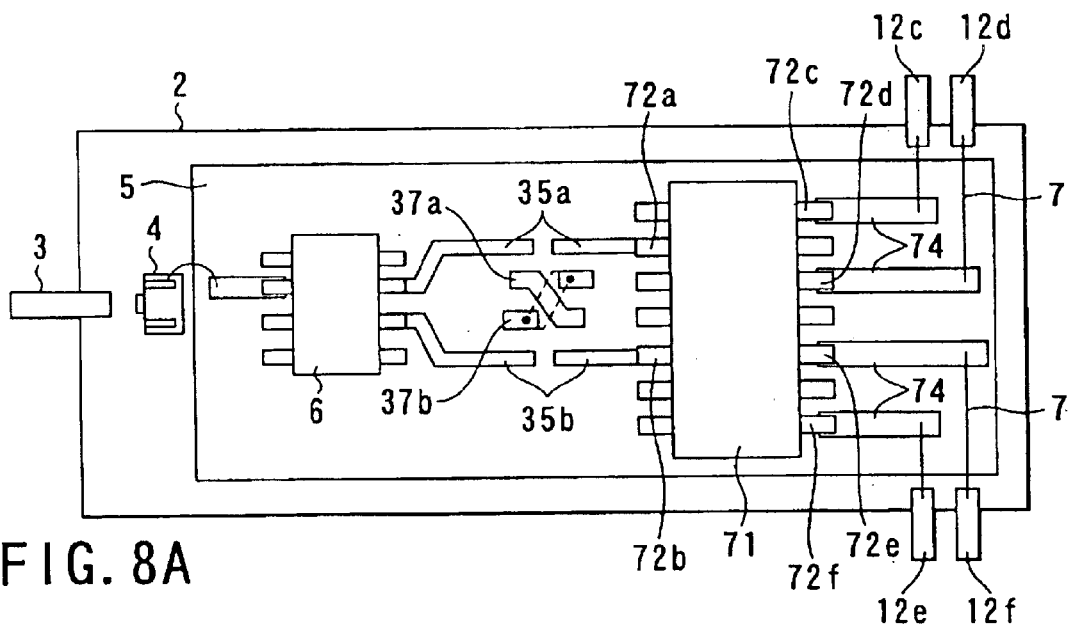
FIG. 8A
| | Connection non-reversed | | Connection reversed | |
|---|---|---|---|---|
| Light signal | ON | OFF | ON | OFF |
| Lead pin 12c | 'H' | 'L' | 'L' | 'H' |
| Lead pin 12d | 'L' | 'H' | 'H' | 'L' |
| Lead pin 12e | Positive tilt | Positive tilt | Positive tilt | Positive tilt |
| Lead pin 12f | Negative tilt | Negative tilt | Negative tilt | Negative tilt |
FIG. 8B

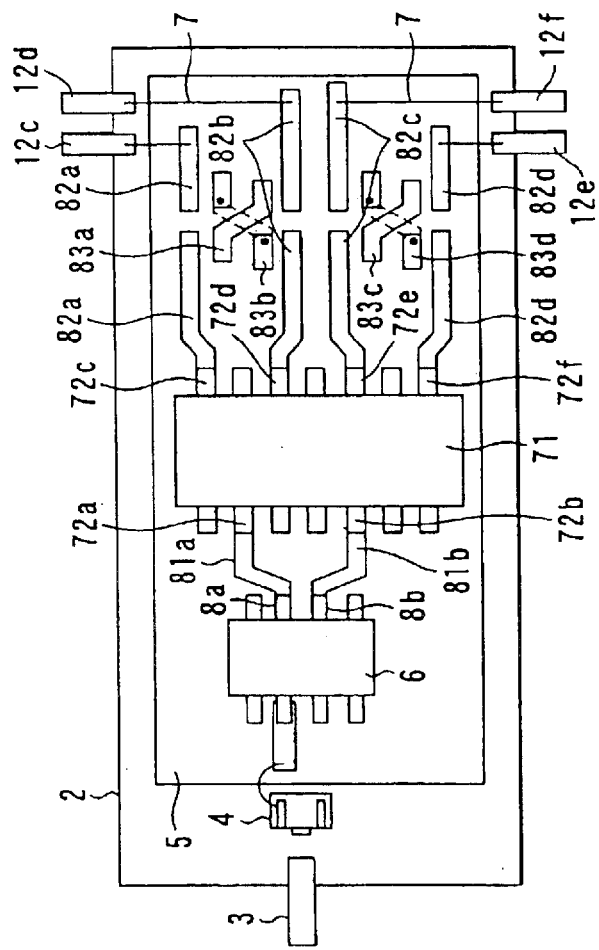

| | Connection non-reversed | | Connection reversed only with data signal | | Connection reversed only with clock signal | | Connection reversed with data and clock signals | |
|---|---|---|---|---|---|---|---|---|
| Light signal | ON | OFF | ON | OFF | ON | OFF | ON | OFF |
| Lead pin 12c | 'H' | 'L' | 'L' | 'H' | 'H' | 'L' | 'L' | 'H' |
| Lead pin 12d | 'L' | 'H' | 'H' | 'L' | 'L' | 'H' | 'H' | 'L' |
| Lead pin 12e | Positive tilt | Negative tilt | Positive tilt | Negative tilt | Negative tilt | Positive tilt | Negative tilt | Positive tilt |
| Lead pin 12f | Negative tilt | Positive tilt | Negative tilt | Positive tilt | Positive tilt | Negative tilt | Positive tilt | Negative tilt |

US 6,794,724 B2

MODULE FOR OPTICAL COMMUNICATIONS FOR CONVERTING LIGHT AND DIFFERENTIAL SIGNALS

CROSS-REFERENCE TO RELATED APPLICATIONS

This application is based upon and claims the benefit of priority from the prior Japanese Patent Application No. 2001-287658, filed Sep. 20, 2001, the entire contents of which are incorporated herein by reference.

BACKGROUND OF THE INVENTION

1. Field of the Invention

The present invention relates to a module for optical communications, for example, which coverts a light signal to signals of a differential form and outputs the signals, or which emits the light signal in response to the inputted differential signals.

2. Description of the Related Art

In recent years, due to the explosive growth of communication demands brought about by the Internet, there are now strong demands for an optical communications system. In an optical communications system, a module for an optical communications for use in a light transmitter/receiver has been required to be reduced in size and cost.

FIG. 10A schematically shows a first example of a conventional module for the optical communications. As shown in FIG. 10A, a module for optical communications 101 includes a package 102 in which a light receiving element and wiring substrate described later are contained. In the package 102, there are disposed: a light receiving element 104 which receives a light incident from an optical fiber 103 and photoelectrically converts the light; and a wiring substrate 105. On the wiring substrate 105, there are disposed: semiconductor devices (hereinafter referred to as IC) such as a preamplifier 106 which amplifies a signal from the light receiving element 104; and wiring patterns 107a, 107b.

For an output of the preamplifier 106, in recent years, a differential output form has frequently been used which has a reverse and non-reverse outputs in order to enhance an SN ratio with respect to an external noise. In this conventional example, for example, a connection pad 108a formed on an upper side outputs the non-reverse output, and a connection pad 108b on a lower side outputs the reverse output. The wiring patterns 107a, 107b substantially have symmetric shapes in a perpendicular direction, and these wiring patterns 107a, 107b are disposed opposite to each other. The connection pads 108a, 108b and wiring patterns 107a, 107b are connected to each other via bonding wires 109. The wiring patterns 107a, 107b are connected to lead pins 110a, 110b in ends of the wiring substrate 105.

The above-described module for optical communications 101 is disposed, for example, on a substrate, and the substrate is assembled in various apparatuses for use.

FIG. 11 shows a second conventional example of the module for optical communications. As shown in FIG. 11, a module for optical communications 121 includes the light receiving element 104 and wiring substrate 105 in the package 102.

An IC 122 is disposed on the wiring substrate 105. The IC 122 includes a connection pin 123a which outputs the reverse output and a connection pin 123b which outputs the non-reverse output. The connection pins 123a, 123b are connected to wiring patterns 124a, 124b. The wiring patterns 124a, 124b are respectively connected to the lead pins 110a, 110b, for example, via bonding wires.

Additionally, in the first conventional example, the lead pin 110a is connected to the connection pad 108a to output the non-reverse output, and the lead pin 10b is connected to the connection pad 108b to output the reverse output. However, in general, the arrangement of these lead pins is not optionally determined. In some apparatus (substrate) in which the module for optical communications 101 is assembled, a side on which the connection pads 108a, 108b of the IC 106 are formed does not meet with a side on which the lead pins 110a, 110b are formed. That is, the lead pin 110a forms the reverse output, and the lead pin 110b forms the non-reverse output. In this case, a separate IC needs to be prepared in which the upper connection pad 108a forms the reverse output, and the lower connection pad 108b forms the non-reverse output. This increases costs. Moreover, the IC with a connection pad arrangement that meets the demand of a user may not be manufactured.

Furthermore, conversely, depending on an IC maker, different from the aforementioned IC 106, the positions of the reverse output and non-reverse output may be reversed. Therefore, similarly, connection relations between the connection pads 108a, 108b and lead pins 110a, 10b need to be reversed.

To switch the reverse and non-reverse outputs of the module for optical communications 101 without changing the arrangement of the wiring patterns 107a, 107b, for example, as shown in FIG. 10B, a method is considered comprising: allowing the bonding wires 109 for connecting the connection pads 108a, 108b to the wiring patterns 107a, 107b to intersect with each other. That is, the connection pad 108a is connected to the wiring pattern 107b, and the connection pad 108b is connected to the wiring pattern 107a.

In this method, however, since the bonding wires 109 intersect, there is a possibility of short-circuit. Moreover, since the bonding wires 109 are disposed in the vicinity of each other, a problem is deterioration of frequency properties by mutual inductance between the bonding wires 109.

Moreover, in the second conventional example, for similar reasons, the connection pins 123a, 123b of the IC 122 may not be on the same side as the lead pins 110a, 110b in some cases. In this case, similarly as the first conventional art, it is necessary to prepare a separate IC that satisfies the condition, or a new wiring substrate 105 including the wiring pattern which satisfies the condition. This not only complicates a manufacturing process of the module for optical communications but also increases costs.

BRIEF SUMMARY OF THE INVENTION

According to a first aspect of the present invention, there is provided a module for optical communications comprising: a light receiving element receiving the light signal and converting the light signal to an electric signal; an insulating substrate including a first major surface and a second major surface opposite to the first major surface; an output section provided on the first major surface and extracting the electric signal as a reverse signal and non-reverse signal; first and second connection terminals connected to the output section, the reverse signal being outputted via the first connection terminal, the non-reverse signal being outputted via the second connection terminal; and first and second wiring patterns provided on the first major surface, one of the first and second wiring patterns being electrically connected to the first connection terminal, the other one of the first and second wiring patterns being electrically connected to the second connection terminal, the first wiring pattern including a first end, the second wiring pattern including a second end, and the first and second ends being provided in order in a direction intersecting with a line connecting the first and second connection terminals.

BRIEF DESCRIPTION OF THE SEVERAL VIEWS OF THE DRAWING

FIGS. 6A and 6B are diagrams schematically showing a connection method of the module for optical communications shown in FIG. 5A, and FIG. 6C is a diagram showing a relation between a light signal of the module of FIGS. 6A and 6B, and an output from a lead pin.

FIG. 7 is a diagram schematically showing the module for optical communications according to a fifth embodiment of the present invention.

FIG. 8A is a diagram schematically showing the module for optical communications according to a sixth embodiment of the present invention, and FIG. 8B is a diagram showing the relation between the light signal of the module of FIG. 8A, and the output from the lead pin.

FIG. 9A is a diagram schematically showing the module for optical communications according to a seventh embodiment of the present invention, and FIG. 9B is a diagram showing the relation between the light signal of the module of FIG. 9A, and the output from the lead pin.

DETAILED DESCRIPTION OF THE INVENTION

Figure 1A:
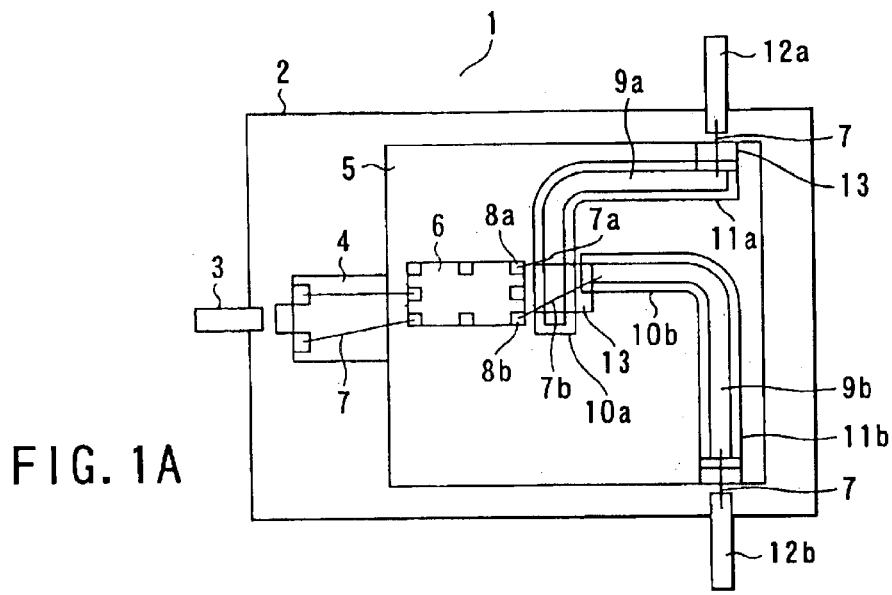
FIGS. 1A and 1B are diagrams schematically showing a module for optical communications according to a first embodiment of the present invention.

Embodiments of the present invention will be described hereinafter with reference to the drawings. Additionally, in the following description, constituting elements including substantially the same functions and constitutions are denoted with the same reference numerals, and a description will be made only if necessary.

(First Embodiment)

FIG. 1A schematically shows a module for optical communications according to a first embodiment of the present invention. As shown in FIG. 1A, a module for optical communications 1 includes a package (envelope) 2 in which a light receiving element and wiring substrate described later are contained. In the package 2, there are disposed: an optical fiber 3; a light receiving element 4 which receives a light signal incident from the optical fiber 3; and a wiring substrate 5 disposed adjacent to the light receiving element 4. The wiring substrate 5 is formed, for example, of silicon and ceramic such as alumina ($Al_2O_3$), aluminum nitride (AlN) and silicon nitride ($Si_3N_4$).

On the wiring substrate 5, an IC 6 is disposed opposite to the light receiving element 4. Examples of the IC 6 includes a preamplifier which is connected to the light receiving element 4 via bonding wires 7 and which amplifies a signal from the light receiving element 4 and outputs differential signals. Moreover, the IC 6 includes a connection pad 8a which forms a non-reverse output, and a connection pad 8b which forms a reverse output. The connection pads (connection terminals) 8a, 8b are arranged along a side disposed opposite to a side on which, for example, the light receiving element 4 is disposed. On the wiring substrate 5, wiring patterns 9a, 9b are disposed. The wiring patterns 9a, 9b are connected to the connection pads 8a, 8b via bonding wires 7a, 7b.

Each of the wiring patterns 9a, 9b can be formed as a so-called coplanar line in which a signal electrode line is formed in a middle and ground electrodes are formed at a predetermined interval in opposite ends. In the following, it is described that the respective bonding wires 7a, 7b are connected to the wiring patterns 9a, 9b. This means that the wires are connected to the signal electrode lines, unless otherwise specified. The coplanar line will be described later in detail.

The wiring patterns 9a, 9b include, for example, first ends 10a, 10b, and second ends 11a, 11b and have substantially L shapes. The wiring patterns 9a, 9b are disposed vertically adjacent to each other. The upper wiring pattern 9a is disposed such that a character L is rotated in a clockwise direction by 90 degrees. The lower wiring pattern 9b is disposed such that the wiring pattern 9a is further rotated in a clockwise direction by 90 degrees.

The first end 10a of the wiring pattern 9a is disposed not to contact the side on which the connection pads 8a, 8b are disposed. The first end 10b of the wiring pattern 9b is disposed opposite to the side on which the connection pads 8a, 8b of the IC 6 are disposed via the wiring pattern 9a in a non-contact state.

The second ends 11a, 11b of the wiring patterns 9a, 9b are positioned in the ends of the wiring substrate 5. The wiring patterns 9a, 9b do not contact each other.

The second end 11a of the wiring pattern 9a is connected to a lead pin 12a via the bonding wire 7, and the second end 11b of the wiring pattern 9b is connected to a lead pin 12b via the bonding wire 7.

A resist 13 consisting of an insulating film such as resin is formed on the wiring pattern 9a disposed between the wiring pattern 9b and IC 6. The bonding wire 7a is disposed over the resist 13.

An operation of the module for optical communications constituted as described above will be described. A light signal incident from the optical fiber 3 is converted to an electric signal by the light receiving element 4. The electric signal converted by the light receiving element 4 is amplified by the IC 6, and outputted as non-reverse and reverse output signals to the outside of the package 2 from the lead pins 12a, 12b via the wiring patterns 9a, 9b.

Figure 1B:
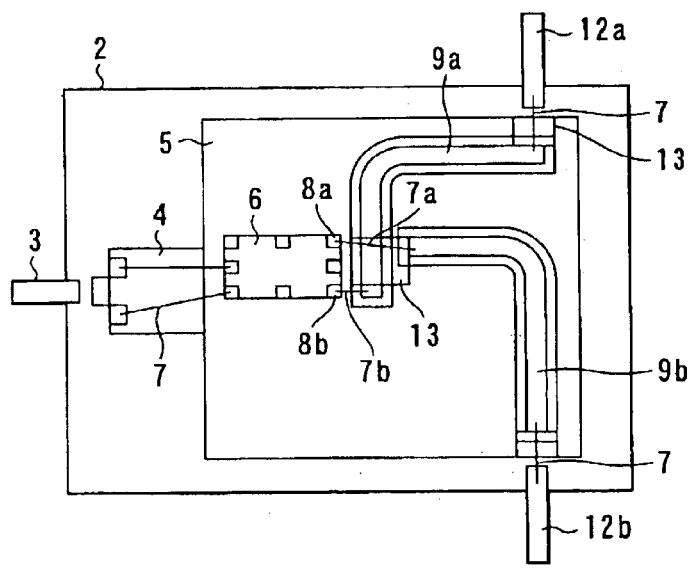

FIG. 1B schematically shows a constitution in which positions of the reverse and non-reverse outputs of the module for optical communications 1 constituted as described above are reversed, the lead pin 12a forms the reverse output, and the lead pin 12b forms the non-reverse output. As shown in FIG. 1B, the bonding wire 7a connected to the connection pad 8a of the non-reverse output of the IC 6 is connected to the wiring pattern 9b over the resist 13. Moreover, the bonding wire 7b connected to the connection pad 8b of the reverse output of the IC 6 is connected to the wiring pattern 9a. Therefore, the lead pin 12a corresponds to the reverse output, and the lead pin 12b corresponds to the non-reverse output.

In addition to the above-described constitution, when the widths of the wiring patterns 9a, 9b are reduced, distances of the bonding wires 7a, 7b extending over the wiring patterns 9a, 9b can be reduced. As a result, the influence of parasitic inductance of the bonding wires 7a, 7b on the wiring patterns 9a, 9b can be reduced. That is, the deterioration of frequency characteristics of the wiring patterns 9a, 9b can be avoided.

However, when the widths of the wiring patterns 9a, 9b are reduced, characteristic impedance increases. As a result, if the widths of the wiring patterns 9a, 9b are too small, it is impossible to set the characteristic impedance to a desired value. To solve the problem, in addition to the above-described constitution, a coplanar line structure is applied to the wiring patterns 9a, 9b. By the coplanar line structure, while the widths of the wiring patterns 9a, 9b are kept to be small, a desired characteristic impedance can be obtained.

Figures 2A, 2B:
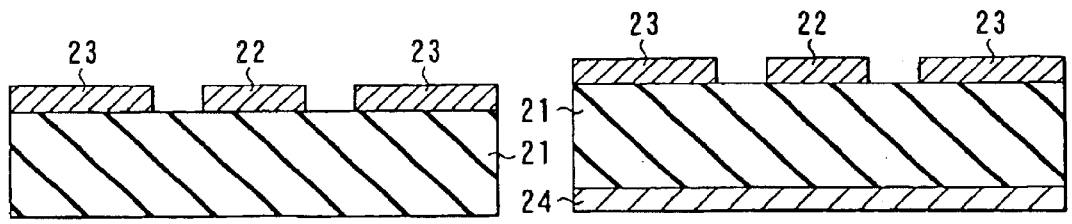
FIGS. 2A and 2B are diagrams schematically showing a structure of a wiring pattern.

Now the coplanar line structure will be described. FIG. 2A is a sectional view schematically showing the structure of the coplanar line. As shown in FIG. 2A, a signal electrode line 22 is formed substantially in a middle on a substrate 21. Ground electrode lines 23 are formed, for example, at a gap of about 0.1 mm on opposite sides of the signal electrode line 22. When the width of the signal electrode line 22 and the gap width are appropriately adjusted, the desired characteristic impedance is obtained. Therefore, when the gap width is set to be as narrow as possible, the desired characteristic impedance is obtained, and the width of the signal electrode line 22 can be reduced. Additionally, the substrate 21 in FIG. 2 corresponds to the wiring substrate 5 in the first embodiment shown in FIGS. 1A and 1B. FIG. 2B will be described later.

According to the first embodiment, two substantially L-shaped wiring patterns 9a, 9b are disposed on the wiring substrate 5, one end of the wiring pattern 9a is disposed adjacent to the IC 6 with a predetermined interval, and one end of the wiring pattern 9b is further disposed adjacent to one end of the wiring pattern 9a. In this manner, the wiring patterns 9a, 9b are disposed vertically adjacent to each other with angles different from each other by 90 degrees. Therefore, a connection relation between the bonding wires 7a, 7b connecting the wiring patterns 9a, 9b to the connection pads 8a, 8b is changed, and then the disagreement of the positional relations can be adjusted.

Moreover, different from the first conventional example, the bonding wires 109 do not have to intersect with each other. Therefore, it is possible to avoid short-circuiting the bonding wires 7a, 7b, and the deterioration of the frequency characteristics by the mutual inductance and parasitic capacity between the bonding wires 7a, 7b.

Furthermore, as described above, when the connection position of the bonding wires 7a, 7b is only changed, the lead pins 12a, 12b can be set to desired outputs. Therefore, it is unnecessary to newly prepare the wiring substrate which satisfies the desired wiring pattern, or to separately prepare an IC in which the connection pads 8a, 8b correspond to the desired outputs. Therefore, a manufacturing cost of the module for optical communications 1 can be reduced.

(Second Embodiment)

Figure 3A:
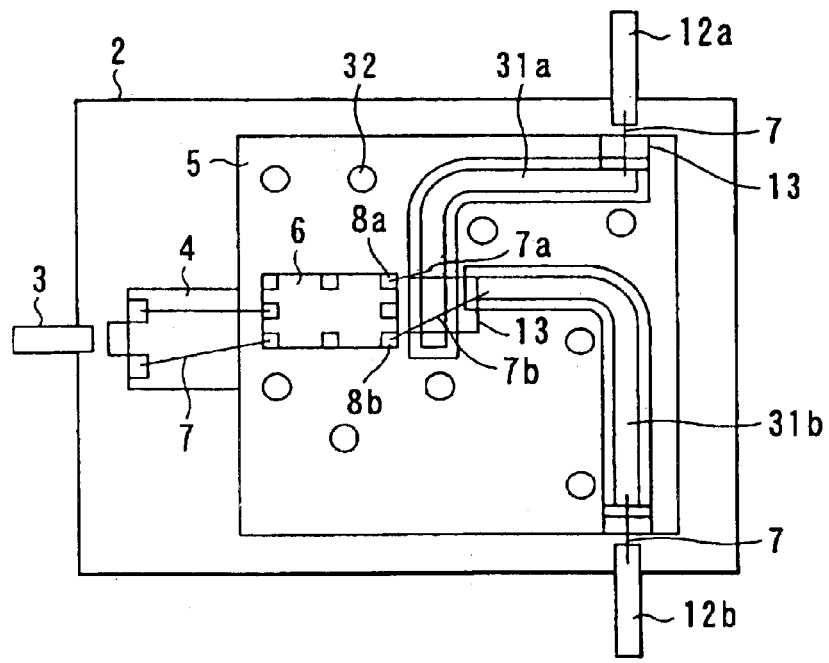
FIGS. 3A and 3B are diagrams schematically showing the module for optical communications according to a second embodiment of the present invention.
Figure 3B:
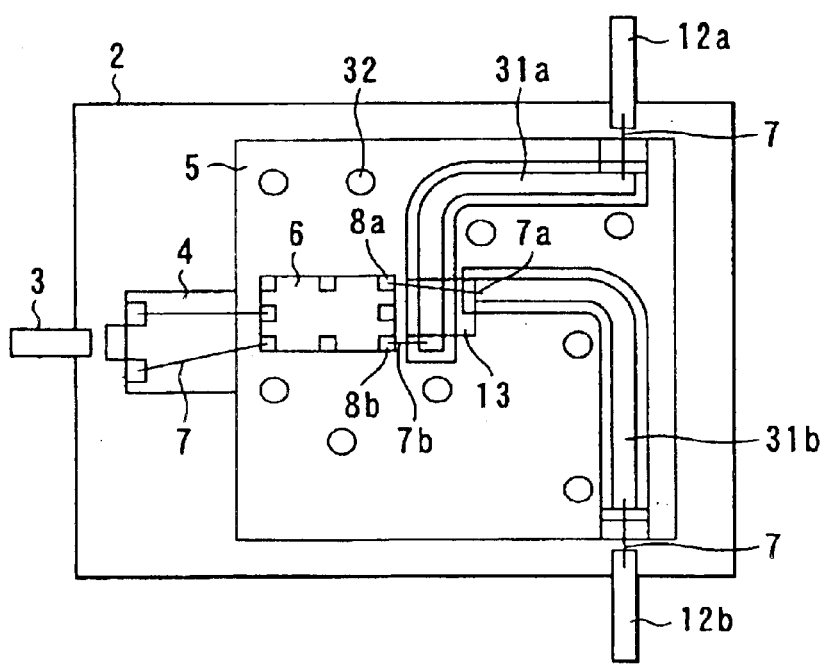

FIG. 3A schematically shows the module for optical communications according to a second embodiment of the present invention. FIG. 3B schematically shows that the relation between the reverse and non-reverse outputs of the lead pins 12a, 12b of the module for optical communications shown in FIG. 3A.

In the first embodiment, as the wiring patterns 9a, 9b, the coplanar lines in which the ground electrode is not disposed in the back surface of the wiring substrate 5 are used. On the other hand, in the second embodiment, grounded coplanar lines 31a, 31b in which the ground electrode is formed on the back surface of the wiring substrate 5 are used. Reference numeral 32 denotes through holes. The other parts are similar to those of the first embodiment.

FIG. 2B schematically shows the structure of the grounded coplanar line. As shown in FIG. 2B, in addition to the structure of the coplanar line of FIG. 2A, the grounded coplanar line includes a structure in which a ground electrode 24 is disposed over the back surface of the substrate 21.

Even when the grounded coplanar line is used, an effect similar to that of the first embodiment can be obtained.

(Third Embodiment)

Figure 4A:
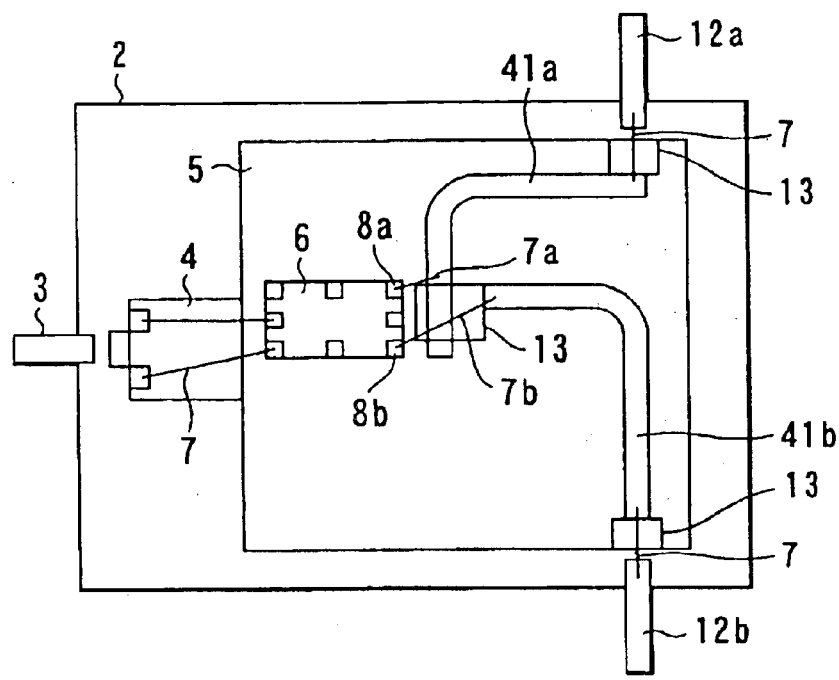
FIGS. 4A and 4B are diagrams schematically showing the module for optical communications according to a third embodiment of the present invention.
Figure 4B:
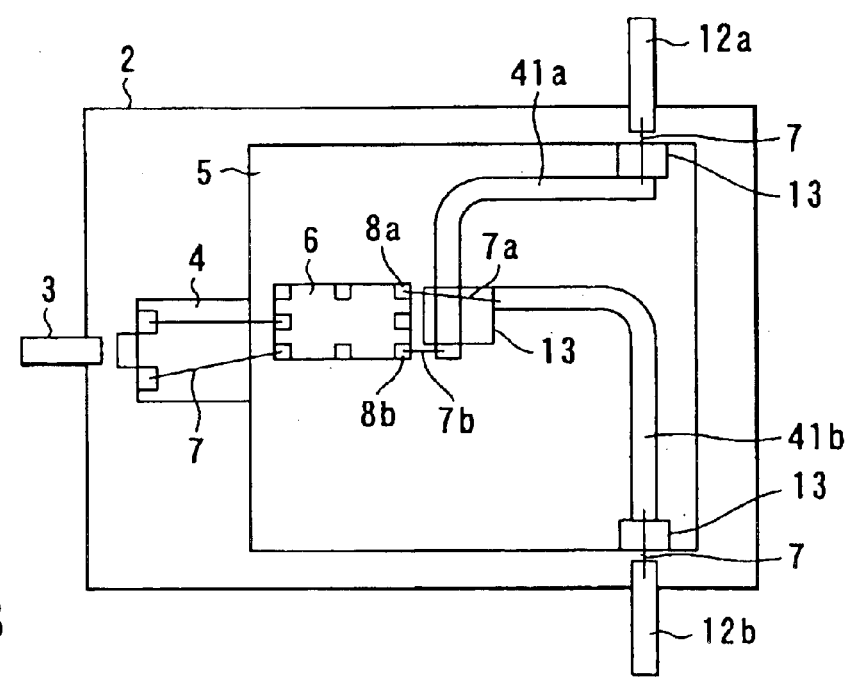

FIG. 4A schematically shows the module for optical communications according to a third embodiment of the present invention. FIG. 4B schematically shows that the relation between the reverse and non-reverse outputs of the lead pins 12a, 12b of the module for optical communications shown in FIG. 4A is changed.

In the first and second embodiments, silicon, ceramic, and the like are used as the wiring substrate 5, and the coplanar line or grounded coplanar line is used as the wiring patterns 9a, 9b. On the other hand, in the third embodiment, as the wiring patterns 9a, 9b, wiring patterns 41a, 41b including a normal structure (micro strip structure) are used, and a material having a high permittivity is used as the wiring substrate 5. Examples of the material having the high permittivity include sapphire, arsenic gallium, barium titanate-based dielectric material, perovskite dielectric material, and the like. With this constitution, the wiring patterns 9a, 9b having small widths and desired characteristic impedances can be formed. The other parts are similar to that of the first embodiment.

According to the third embodiment, the effect similar to those of the first embodiment is obtained.

(Fourth Embodiment)

Figure 5A:
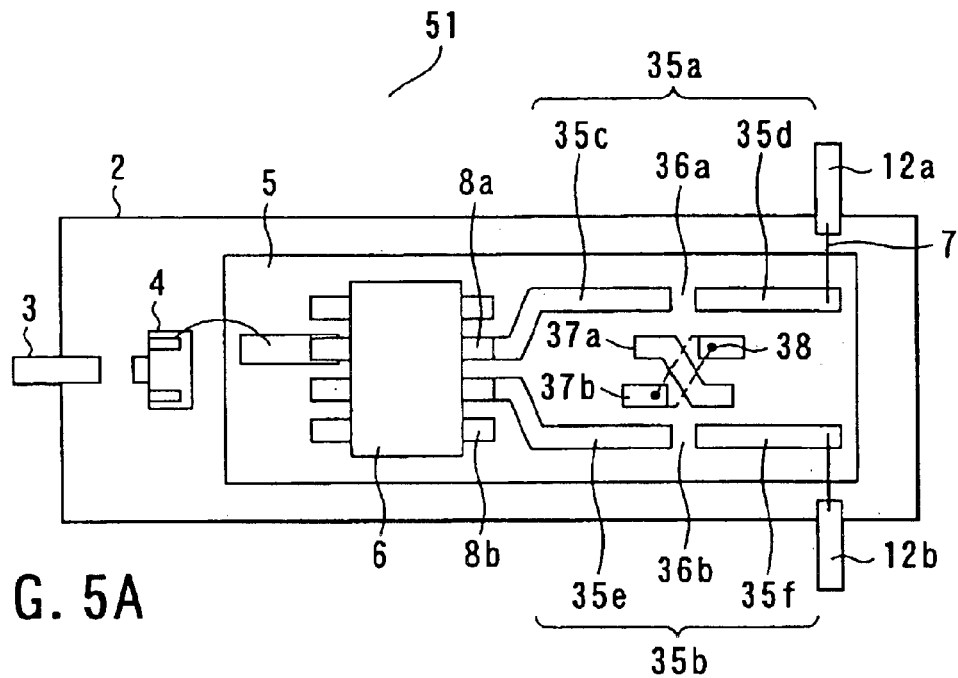
FIG. 5A is a diagram schematically showing the module for optical communications according to a fourth embodiment of the present invention.

FIG. 5A schematically shows the module for optical communications according to a fourth embodiment of the present invention. As shown in FIG. 5A, a module for optical communications 51, the optical fiber 3, light receiving element 4, and wiring substrate 5 disposed adjacent to the light receiving element 4 are disposed in the package 2. On the wiring substrate 5, the IC 6 such as the preamplifier is disposed opposite to the light receiving element 4. The connection pad 8a of the IC 6 corresponds, for example, to the non-reverse output, and the pad 8b corresponds to the reverse output. On the wiring substrate 5, wiring patterns 35a, 35b are connected to connection pins 8a, 8b.

The wiring patterns 35a, 35b includes, for example, major portions which have linear shapes. Moreover, the wiring patterns 35a, 35b are vertically disposed substantially in parallel to each other with a predetermined interval. Moreover, as described above, one part of each pattern is bent so that one end of the pattern is connected to each of the connection pins 8a, 8b of the IC 6. This bent shape may be any shape as long as one end of the wiring patterns 35a, 35b are formed so as to be connected to the connection pins 8a, 8b of the IC 6.

Linear portions of the wiring patterns 35a, 35b have void portions 36a, 36b of the patterns substantially in the middle thereof. These portions are formed so as to be non-conductive, and thereby each pattern is separated into two parts. That is, the wiring pattern 35a includes first and second wiring patterns 35c and 35d. One end of the first wiring pattern 35c is connected to the connection pin 8a. One end of the second wiring pattern 35d is disposed opposite to the other end of the first wiring pattern 35c via the void portion 36a. Similarly, the wiring pattern 35b includes third and fourth wiring patterns 35e and 35f. One end of the third wiring pattern 35e is connected to the connection pin 8b. One end of the fourth wiring pattern 35f is disposed opposite to the other end of the third wiring pattern 35e via the void portion 36b.

First, second intersecting patterns 37a, 37b are disposed between the wiring patterns 35a, 35b. The first wiring pattern 37a is disposed on the surface of the wiring substrate 5. Moreover, one end of the first intersecting pattern 37a has an interval from the other end of the first wiring pattern 35c, and the other end thereof has an interval from one end of the fourth wiring pattern 35f.

Figure 5B:
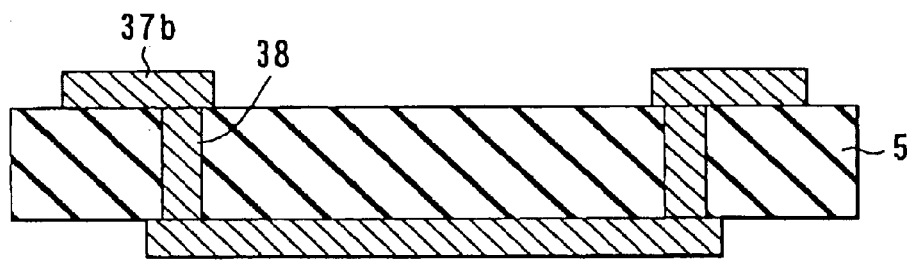
FIGS. 5B and 5C are diagrams showing an example of a second intersecting pattern of FIG. 5A.
Figure 5C:
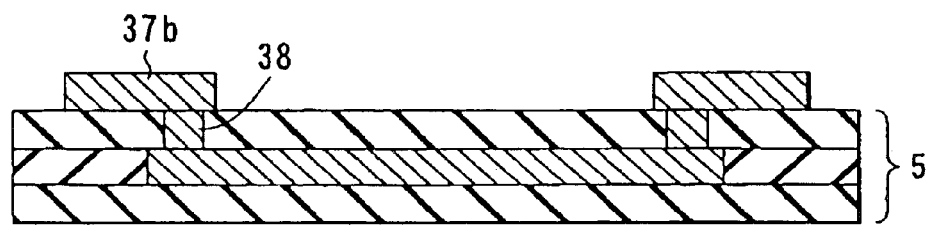
Figure 10A:
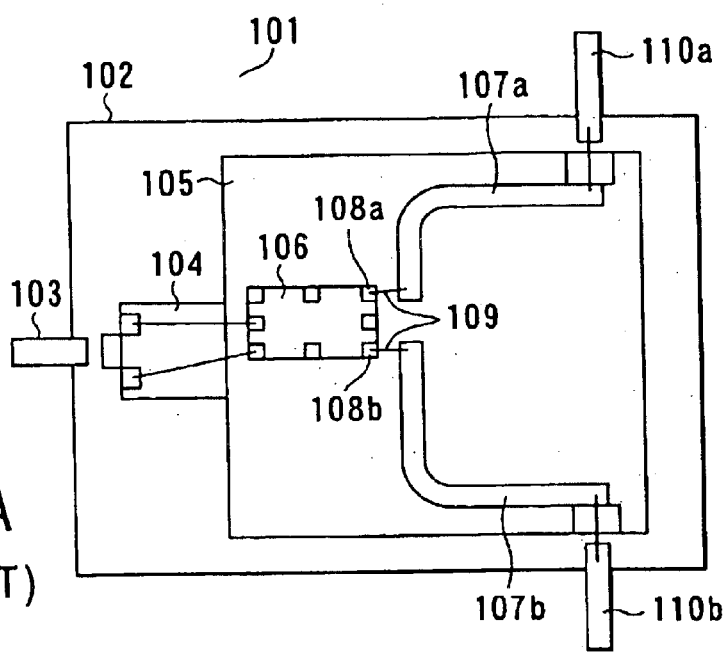
FIGS. 10A and 10B are diagrams schematically showing a first conventional example of the module for optical communications.
Figure 10B:
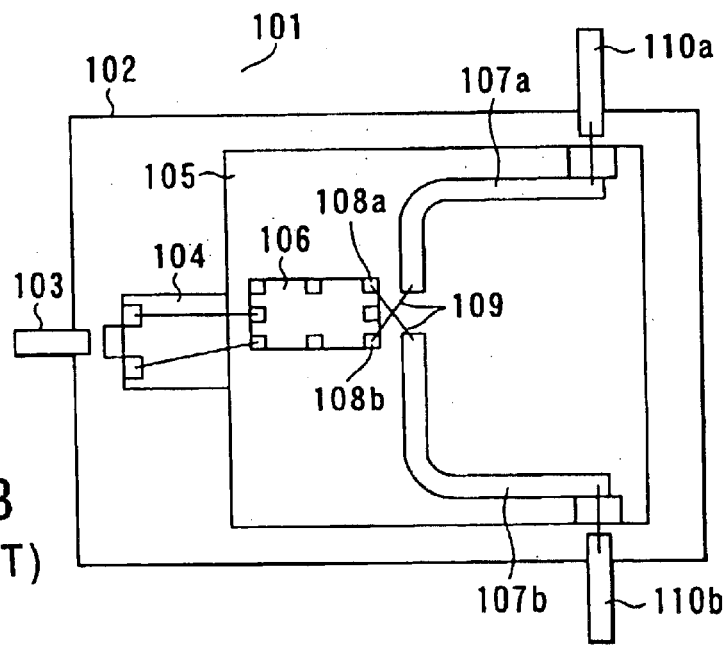
Figure 11:
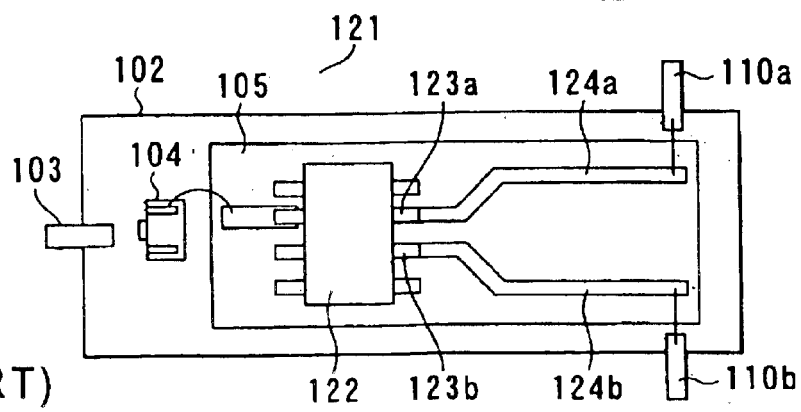
FIG. 11 is a diagram schematically showing a second conventional example of the module for optical communications.

Opposite ends of the second intersecting pattern 37b are disposed on the surface of the wiring substrate 5, and portions connecting the opposite ends of the pattern to each other are disposed on the back surface of the wiring substrate 5 as shown in FIGS. 5B and 5C in more detail. FIGS. 5B and 5C are diagrams showing one example of a section taken along the second intersecting pattern 37b of FIG. 5A. Additionally, in these drawings, the first intersecting pattern 37a is omitted. As shown in FIG. 5A, one end of the second intersecting pattern 37b has an interval from one end of the second wiring pattern 35d in the surface of the wiring substrate 5. Moreover, the other end also has an interval from the other end of the third wiring pattern 35e. Moreover, as shown in FIG. 5B, the connecting portion of the second intersecting pattern 37b is disposed on the back surface of the wiring substrate 5. These opposite ends and connecting portion of the second intersecting pattern are connected to one another via through holes 38 formed in the wiring substrate 5. Furthermore, as shown in FIG. 5C, the wiring substrate 5 may have a multilayered structure. In this case, the connecting portion can be disposed between the layers.

The second and fourth wiring patterns 35d, 35f are connected to the lead pins 12a, 12b via the bonding wires 7.

FIGS. 6A and 6B schematically show the connected state of the wiring patterns 35a, 35b to the first and second intersecting patterns 37a, 37b in the module for optical communications 51 shown in FIG. 5A. A method of connecting the wiring patterns 35a, 35b to the first and second intersecting patterns 37a, 37b will be described hereinafter with reference to FIGS. 6A and 6B.

As shown in FIG. 6A, conductive connection patterns 39 are disposed to electrically connect the void portion 36a of the wiring pattern 35a. In this case, the first wiring pattern 35c is connected to the second wiring pattern 35d, and the lead pin 12a outputs the non-reverse output. Similarly, the connection patterns 39 are disposed to electrically connect the void portion 36b of the wiring pattern 35b. In this case, the third wiring pattern 35e is connected to the fourth wiring pattern 35f, and the lead pin 12b outputs the reverse output.

Additionally, as the connection patterns 39, conductive members such as a resistor of substantially 0 ohm, wire bonding and capacitor can be used. When the capacitor is used, the void portions 36a, 36b can be connected substantially with no resistance value with respect to an alternating signal.

On the other hand, as shown in FIG. 6B, the connection pattern 39 is used to connect the other end of the first wiring pattern 35c to one end of the first intersecting pattern 37a, and to connect the other end of the first intersecting pattern 37a to one end of the fourth wiring pattern 35f. In this case, the lead pin 12b outputs the non-reverse output. Similarly, the connection pattern 39 is used to connect one end of the second wiring pattern 35d to one end of the second intersecting pattern 37b, and to connect the other end of the second intersecting pattern 37b to the other end of the third wiring pattern 35e. In this case, the lead pin 12a outputs the reverse output.

FIG. 6C shows a relation with a light signal and outputs from the lead pins 12a, 12b in the connection of the void portions 36a, 36b (connection non-reverse) and in the connection of the void portions via the first and second intersecting patterns 37a, 37b (connection reverse). As shown in FIG. 6C, when the connection is reversed or not reversed, the outputs of the lead pins 12a, 12b are reversed.

According to the fourth embodiment, the wiring pattern 35a is connected to the connection pin 8a of the IC 6, and includes the void portion 36a in the middle thereof, and the wiring pattern 35b is connected to the connection pin 8b, and includes the void portion 36b in the middle thereof. Furthermore, the first and second intersecting patterns 37a, 37b are disposed on the front and back surfaces of the wiring substrate 5 between the wiring patterns 35a, 35b. The connection pattern 39 is used to connect the void portions 36a, 36b, or to connect the wiring patterns 35a, 35b via the first and second intersecting patterns 37a, 37b, so that the lead pins 12a, 12b can output desired outputs. Therefore, even when the positional relation between the reverse and non-reverse outputs of the connection pins 8a, 8b of the IC 6 does not agree with the desired positional relation between the reverse and non-reverse outputs of the lead pins 12a, 12b, the connection relation between the reverse and non-reverse outputs can be changed so as to adjust the disagreement of the positional relation.

Moreover, as described above, when the connection relations of the wiring patterns 35a, 35b and first and second intersecting patterns 37a, 37b are only changed, the lead pins 12a, 12b can output the desired outputs. Therefore, it is unnecessary to prepare a new wiring substrate which satisfies the desired wiring pattern, or to separately prepare the IC in which the connection pins 8a, 8b output the desired outputs. This can reduce the manufacturing cost of the module for optical communications 51.

(Fifth Embodiment)

FIG. 7 schematically shows the module for optical communications according to a fifth embodiment of the present invention. In the fourth embodiment, the portions connecting the opposite ends of the second intersecting pattern 37b are formed in the back surface or inner layer of the wiring substrate 5. On the other hand, in the fifth embodiment, the connecting portions include bonding wires 61 disposed on the surface of the wiring substrate 5. The other parts are similar to the fourth embodiment.

According to the fifth embodiment, the effect similar to that of the fourth embodiment is obtained. Moreover, when the connecting portion cannot be formed in the back surface or inner layer of the wiring substrate 5, it is easy to form the second intersecting pattern 37b.

(Sixth Embodiment)

FIG. 8A schematically shows the module for optical communications according to a sixth embodiment of the present invention. In the sixth embodiment, there is further provided an IC 71 such as a CDR IC in addition to the module for optical communications according to the fifth embodiment. The IC 71 outputs differential signals, which is inputted to the IC 71 or regenerated, and differential clock signals generated in response to the differential signals.

As shown in FIG. 8A, one end of the wiring patterns 35a, 35b are connected to the IC 6. The other end of the patterns are connected to connection pins 72a, 72b of the IC 71. In the IC 71, connection pins 72c, 72d output differential signals, which are inputted to the IC 71 or regenerated, and connection pins 72e, 72f output differential signals of clock signals. The differential clock signals' periods are half time long of the period of the differential signals. Connection pins 72c to 72e are connected to lead pins 12c to 12f via wiring patterns 74 and bonding wires 7.

FIG. 8B shows the output signals of the lead pins 12c to 12f, when the connection of the module for optical communications shown in FIG. 8A is reversed or non-reversed. In FIG. 8B, a positive tilt indicates a signal whose edge rises in a middle point in a half cycle of the light signal, and a negative tilt indicates a signal whose edge falls in the middle point. As shown in FIG. 8B, with the connection reverse or non-reverse, the lead pins 12c, 12d can output desired outputs.

According to the sixth embodiment, the effect similar to that of the fourth embodiment is obtained.

(Seventh Embodiment)

FIG. 9A schematically shows the module for optical communications according to a seventh embodiment of the present invention. In the seventh embodiment, structures of the wiring patterns 35a, 35b and first and second intersecting patterns 37a, 37b described in the fourth embodiment are applied to an output section of the IC 71.

As shown in FIG. 9A, the connection pins 8a, 8b of the IC 6 are connected to connection pins 72a, 72b of the IC 71 via wiring patterns 81a, 81b. One end of wiring patterns 82a, 82b are connected to connection pins 72c, 72d of the IC 71. The wiring patterns 82a, 82b include non-conductive void portions, and intersecting patterns 83a, 83b are disposed between the intersecting patterns 82a, 82b.

One end of wiring patterns 82c, 82d are connected to connection pins 72e, 72f of the IC 71. The wiring patterns 82c, 82d include non-conductive void portions, and intersecting patterns 83c, 83d are disposed between the intersecting patterns 82c, 82d.

The data signal from the IC 6 is supplied to the IC 71, and outputted via the connection pins 72c, 72d of the IC 71. Therefore, the data signals are outputted to the outside of the module via the lead pins 12c, 12d. Similarly, clock signals are outputted via connection pins 72e, 72f of the IC 71, and outputted to the outside of the module via lead pins 12e, 12f.

FIG. 9B shows the output signals of the lead pins 12c to 12f in the reversed and non-reversed connections of the module for optical communications shown in FIG. 9A. As shown FIG. 9B, in the reversed and non-reversed connections of the light and clock signals, polarities of the lead pins 12c, 12d, and 12e, 12f are independently reversed.

According to the seventh embodiment, the effect similar to that of the fourth embodiment is obtained. Furthermore, when the wiring and intersecting patterns of the fourth embodiment are applied to the output of the IC 71, the polarities of the lead pins 12c, 12d outputting the data signals and the polarities of the lead pins 12e, 12f outputting the clock signals can independently be reversed.

In the first to third embodiments, each of the wiring patterns 9a (31a, 41a), 9b (31b, 41b) has an L shape, and these patterns are disposed vertically adjacent to one another. However, the patterns are not limited to these shapes and arrangements. That is, the wiring pattern does not have to have the L shape. Moreover, the positions of the connection pads 8a, 8b are not limited to those shown in FIG. 1.

Concretely, the wiring patterns 9a, 9b may have shapes and arrangements such that the first ends 10a (31a, 41a), 10b (31b, 41b) are disposed in order in a direction intersecting with the line connecting the connection pads 8a, 8b.

Moreover, in the fourth embodiment, the first and second wiring patterns 35c, 35d, and third and fourth wiring patterns 35e, 35f are not limited to the shapes and arrangements shown in FIG. 5. Similarly, the positions of the connection pins 8a, 8b are not limited to those shown in FIG. 5, as long as the major portions of the linear shapes of the wiring patterns 35a, 35b are arranged along at least a direction intersecting with a direction connecting the connection pins 8a, 8b. For example, the first and third wiring patterns 35c, 35e may slightly vertically deviate from the second and fourth wiring patterns 35d, 35f. This also applies to the fifth to seventh embodiments.

Moreover, in the fourth embodiment, the first and second intersecting patterns 37a, 37b are disposed on the front and back surfaces of the wiring substrate 5. However, this is not limited. The second intersecting pattern 37b may intersect with the first intersecting pattern 37a without contacting the pattern. That is, the patterns may intersect each other in a direction which heads from the front surface of the wiring substrate 5 to the back surfaces. This also applies to the sixth and seventh embodiments.

Furthermore, in the first to fifth embodiments, the light from the optical fiber 3 is received and photoelectrically converted by the light receiving element 4, and the differential signals are outputted and amplified by the IC 6 in the constitution. However, the light signal can also be emitted to the optical fiber 3 in response to the differential signals inputted via the lead pins 12a, 12b. In this case, the IC 6 may drive a light emitting element, and the light emitting element which emits a light signal in response to the signal from the IC is disposed instead of the light receiving element 4.

Moreover, in the fourth to seventh embodiments, the wiring patterns 35d, 35f are connected to the lead pins 12a, 12b via the bonding wires 7. However, this is not limited. For example, the wiring patterns 35d, 35f may also be disposed in the vicinity of the lead pins 7a, 7b and soldered/bonded to the pins.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A module for optical communications, which converts a light signal to differential signals, comprising:

a light receiving element receiving the light signal and converting the light signal to an electric signal;

an insulating substrate including a first major surface and a second major surface opposite to the first major surface;

an output section provided on the first major surface and extracting the electric signal as a reverse signal and non-reverse signal;

first and second connection terminals connected to the output section, the reverse signal being outputted via the first connection terminal, the non-reverse signal being outputted via the second connection terminal; and first and second wiring patterns provided on the first major surface, one of the first and second wiring patterns being electrically connected to the first connection terminal, the other one of the first and second wiring patterns being electrically connected to the second connection terminal, the first wiring pattern including a first end, the second wiring pattern including a second end, and the first end being provided between an imaginary line connecting the first and second connection terminals and the second end.

2. The module according to claim 1, further comprising:
a package covering the light receiving element, the substrate, the output section, the first and second connection terminals, the first and second wiring patterns; and
lead pins projecting from the package and respectively connected to the first and second wiring pattern.

3. The module according to claim 1, further comprising:
an insulating film provided on the first wiring pattern; and
connection wires connecting the first connection terminal to the one of the first and second wiring patterns and connecting the second connection terminal to the other one of the first and second wiring patterns.

4. The module according to claim 1, wherein each of the first and second wiring patterns comprises:
a signal line; and
ground lines provided at a predetermined interval on opposite sides of the signal line.

5. The module according to claim 1, wherein the substrate essentially consists of a material selected from a group consisting of sapphire, arsenic gallium, barium titanate-based dielectric material, and perovskite dielectric material.

6. A module for optical communications, which converts a light signal to differential signals, comprising:
a light receiving element receiving the light signal and converting the light signal to an electric signal;
an insulating substrate including a first major surface and a second major surface opposite to the first major surface;
an output section provided on the first major surface and extracting the electric signal as a reverse signal and non-reverse signal;
first and second connection terminals connected to the output section, the reverse signal being outputted via the first connection terminal, the non-reverse signal being outputted via the second connection terminal;
first wiring pattern provided on the first major surface, the first wiring pattern being opposite to the first connection terminal in a non-contact state;
second wiring pattern provided on the first major surface, the second wiring pattern being opposite to the second connection terminal in a non-contact state;
first intersecting pattern including one end and the other end, the one end being opposite to the first connection terminal in a non-contact state, the other end being opposite to the second wiring pattern in a non-contact state; and
second intersecting pattern including one end and the other end, the one end being opposite to the second connection terminal in a non-contact state, the other end being opposite to the first wiring pattern in a non-contact state, the second intersecting pattern intersecting with the first intersecting pattern in a non-contact state in a direction heading from the first major surface to the second major surface.

7. The module according to claim 6, further comprising:
a conductive connection pattern,
wherein the connection pattern performs a connection selected from a group consisting of connections between the first connection terminal and the first wiring pattern and between the second connection terminal and the second wiring pattern, and connections between the first connection terminal and the second wiring pattern via the first intersecting pattern and between the second connection terminal and the first wiring pattern via the second intersecting pattern.

8. The module according to claim 6, further comprising:
a package covering the light receiving element, the substrate, the output section, the first and second connection terminals, the first and second wiring patterns, the first and second intersecting patterns; and
lead pins projecting from the package and respectively connected to the first and second wiring patterns.

9. The module according to claim 6, wherein the first intersecting pattern and the one and the other ends of the second intersecting pattern are provided on the first major surface, and
a connecting line for electrically connecting one end of the second intersecting pattern to the other end thereof is provided on the second major surface.

10. The module according to claim 6, wherein the substrate comprises a multilayered structure, and
a connecting line for electrically connecting one end of the second intersecting pattern to the other end thereof is provided between the layers in the substrate.

11. The module according to claim 6, wherein a portion connecting one end of the second intersecting pattern to the other end thereof is a wire.

12. The module according to claim 6, further comprising:
a semiconductor device including a third connection terminal connected to the first wiring pattern, and a fourth connection terminal connected to the second wiring pattern, the semiconductor device outputting the supplied reverse and non-reverse signals and differential clock signals.

13. A module for optical communications, which converts differential signals to a light signal, comprising:
an insulating substrate including a first major surface and a second major surface opposite to the first major surface;
first and second connection terminals respectively supplied with the reverse and non-reverse signals:
an input section provided on the first major surface, the input section being connected to the first and second connection terminals, and outputting an electric signal in response to the reverse and non-reverse signals;
a light emitting element emitting the light signal in response to the electric signal; and
first and second wiring patterns provided on the first major surface, one of the first and second wiring patterns being electrically connected to the first connection terminal, the other one of the first and second wiring patterns being electrically connected to the second connection terminal, the first wiring pattern including a first end, the second wiring pattern including a second end, and the first end being provided between an imaginary line connecting the first and second connection terminals and the second end.

14. The module according to claim 13, further comprising:
a package covering the light emitting element, the substrate, the input section, the first and second connection terminals, the first and second wiring patterns; and
lead pins projecting from the package and respectively connected to the first and second wiring patterns.

15. The module according to claim 13, further comprising:
an insulating film provided on the first wiring pattern; and
connection wires connecting the first connection terminal to the one of the first and second wiring patterns and connecting the second connection terminal to the other one of the first and second wiring patterns.

16. The module according to claim 13, wherein each of the first and second wiring patterns comprises:
   a signal line; and
   ground lines provided at a predetermined interval on opposite sides of the signal line.

17. The module according to claim 13, wherein the substrate essentially consists of a material selected from a group consisting of sapphire, arsenic gallium, barium titanate-based dielectric material, and perovskite dielectric material.

18. A module for optical communications, which converts a light signal to differential signals, comprising:
   an insulating substrate including a first major surface and a second major surface opposite to the first major surface;
   first and second connection terminals respectively supplied with the reverse and non-reverse signals;
   an input section provided on the first major surface, the input section being connected to the first and second connection terminals, and outputting an electric signal in response to the reverse and non-reverse signals;
   a light emitting element emitting the light signal in response to the electric signal;
   first wiring pattern provided on the first major surface, the first wiring pattern being opposite to the first connection terminal in a non-contact state;
   second wiring pattern provided on the first major surface, the second wiring pattern being opposite to the second connection terminal in a non-contact state;
   first intersecting pattern including one end and the other end, the one end being opposite to the first connection terminal in a non-contact state, the other end being opposite to the second wiring pattern in a non-contact state; and
   second intersecting pattern including one end and the other end, the one end being opposite to the second connection terminal in a non-contact state, the other end being opposite to the first wiring pattern in a non-contact state, the second intersecting pattern intersecting with the first intersecting pattern in a non-contact state in a direction heading from the first major surface to the second major surface.

19. The module according to claim 18, further comprising:
   a conductive connection pattern,
   wherein the connection pattern performs a connection selected from a group consisting of connections between the first connection terminal and the first wiring pattern and between the second connection terminal and the second wiring pattern, and connections between the first connection terminal and the second wiring pattern via the first intersecting pattern and between the second connection terminal and the first wiring pattern via the second intersecting pattern.

20. The module according to claim 18, further comprising:
   a package covering the light emitting element, the substrate, the input section, the first and second connection terminals, the first and second wiring patterns, the first and second intersecting patterns; and
   lead pins projecting from the package and respectively connected to the first and second wiring patterns.

21. The module according to claim 18, wherein the first intersecting pattern and the one and the other ends of the second intersecting pattern are provided on the first major surface, and
   a connecting line for electrically connecting one end of the second intersecting pattern to the other end thereof is provided on the second major surface.

22. The module according to claim 18, wherein the substrate comprises a multilayered structure, and
   a connecting line for electrically connecting one end of the second intersecting pattern to the other end thereof is provided between the layers in the substrate.

23. The module according to claim 18, wherein a portion connecting one end of the second intersecting pattern to the other end thereof is a wire.

* * * * *